(12) United States Patent
Tominaga et al.

(10) Patent No.: US 12,219,735 B2
(45) Date of Patent: Feb. 4, 2025

(54) COOLING DEVICE AND METHOD FOR MANUFACTURING THE SAME

(71) Applicant: MITSUI CHEMICALS, INC., Tokyo (JP)

(72) Inventors: Takahiro Tominaga, Ichihara (JP); Kazuki Kimura, Sodegaura (JP)

(73) Assignee: MITSUI CHEMICALS, INC., Tokyo (JP)

( * ) Notice: Subject to any disclaimer, the term of this patent is extended or adjusted under 35 U.S.C. 154(b) by 546 days.

(21) Appl. No.: 17/425,181

(22) PCT Filed: May 15, 2020

(86) PCT No.: PCT/JP2020/019491
§ 371 (c)(1),
(2) Date: Jul. 22, 2021

(87) PCT Pub. No.: WO2020/241314
PCT Pub. Date: Dec. 3, 2020

(65) Prior Publication Data
US 2022/0124943 A1 Apr. 21, 2022

(30) Foreign Application Priority Data

May 28, 2019 (JP) ................................ 2019-099573
Jun. 5, 2019 (JP) ................................ 2019-105544

(51) Int. Cl.
*H05K 7/20* (2006.01)
*F28F 3/10* (2006.01)
(Continued)

(52) U.S. Cl.
CPC .......... *H05K 7/20272* (2013.01); *F28F 3/10* (2013.01); *F28F 3/12* (2013.01); *F28F 21/067* (2013.01);
(Continued)

(58) Field of Classification Search
CPC ... H05K 7/20272; H05K 7/20254; F28F 3/10; F28F 3/12; F28F 21/067; F28F 21/081;
(Continued)

(56) References Cited

U.S. PATENT DOCUMENTS 6,295,199 B1 * 9/2001 Le Gouil ............. H05K 1/0203
361/689
7,564,129 B2 * 7/2009 Nakanishi ................. F28F 3/12
257/713
(Continued)

FOREIGN PATENT DOCUMENTS

| CN | 104411423 B | * | 8/2016 | ............. B21D 39/00 |
| CN | 107195604 A | * | 9/2017 | ............. H01L 21/50 |

(Continued)

OTHER PUBLICATIONS

International Searching Authority, "International Search Report," issued in connection with International Patent Application No. PCT/JP2020/019491, dated Aug. 11, 2020.

(Continued)

*Primary Examiner* — Ljiljana V. Ciric
(74) *Attorney, Agent, or Firm* — Foley & Lardner LLP

(57) ABSTRACT

A cooling device, including at least one of following: a casing and a flow channel that is disposed inside the casing, the casing including a metal portion and a resin portion that is bonded to at least a portion of the metal portion; a casing that includes a metal, a flow channel that is disposed inside the casing, and a component that includes a resin and is bonded to a surface of the casing, and a method of manufacturing the cooling device including the steps of a first process of bonding the component to the first metal member by injection molding and a second process of connecting the second metal member with the first metal member to which the component is bonded.

7 Claims, 6 Drawing Sheets

(51) Int. Cl.
*F28F 3/12* (2006.01)
*F28F 21/06* (2006.01)
*F28F 21/08* (2006.01)
*H01L 23/473* (2006.01)

(52) U.S. Cl.
CPC .......... *F28F 21/081* (2013.01); *H01L 23/473* (2013.01); *H05K 7/20254* (2013.01)

(58) Field of Classification Search
CPC ....... F28F 21/00; F28F 21/065; H01L 23/473; B23K 31/02
See application file for complete search history.

(56) References Cited

U.S. PATENT DOCUMENTS

| | | | | |
|---|---|---|---|---|
| 8,472,195 | B2* | 6/2013 | Nakanishi | H01L 23/473 |
| | | | | 174/16.3 |
| 9,640,688 | B2* | 5/2017 | Bosch | H01L 31/048 |
| 10,128,167 | B2* | 11/2018 | Morozumi | H01L 21/50 |
| 2007/0163750 | A1 | 7/2007 | Bhatti et al. | |
| 2019/0107337 | A1 | 4/2019 | Kimura | |

FOREIGN PATENT DOCUMENTS

| | | | | | |
|---|---|---|---|---|---|
| CN | 108139181 | A | | 6/2018 | |
| DE | 102017201545 | A1 | * | 9/2017 | ............. H01L 21/50 |
| JP | S5989998 | A | | 5/1984 | |
| JP | 2004271161 | A | * | 9/2004 | ....... B29C 45/14467 |
| JP | 2005340681 | A | * | 12/2005 | ............. F28F 21/067 |
| JP | 2007-227902 | A | | 9/2007 | |
| JP | 2011-238728 | A | | 11/2011 | |
| JP | 5492447 | B2 | * | 5/2014 | ............. B60K 6/365 |
| JP | 2014204111 | A | * | 10/2014 | |
| JP | 2015082590 | A | * | 4/2015 | |
| JP | 2015-210032 | A | | 11/2015 | |
| JP | 2016-009776 | A | | 1/2016 | |
| JP | 2017-022260 | A | | 1/2017 | |
| JP | 2017-022374 | A | | 1/2017 | |
| JP | 2017018990 | A | * | 1/2017 | ............. B21D 17/02 |
| JP | 2017168570 | A | * | 9/2017 | ............. H01L 21/50 |
| JP | 6265176 | B2 | * | 1/2018 | ............. B21D 17/02 |
| JP | 2020088109 | A | * | 6/2020 | |
| KR | 20190121309 | A | * | 10/2019 | |
| KR | 20210135570 | A | * | 11/2021 | |
| WO | WO-2020196878 | A1 | * | 10/2020 | ............. B60L 3/0046 |

OTHER PUBLICATIONS

International Searching Authority, "Written Opinion," issued in connection with International Patent Application No. PCT/JP2020/019491, dated Aug. 11, 2020.

* cited by examiner

COOLING DEVICE AND METHOD FOR MANUFACTURING THE SAME

CROSS-REFERENCE TO RELATED APPLICATIONS

The present application claims priority under 37 U.S.C. § 371 to International Patent Application No. PCT/JP2020/019491, filed May 15, 2020, which claims priority to and the benefit of Japanese Patent Application Nos. 2019-099573, filed on May 28, 2019, and 2019-105544, filed on Jun. 5, 2019. The contents of these applications are hereby incorporated by reference in their entireties.

TECHNICAL FIELD

The invention relates to a cooling device and a method for manufacturing a cooling device.

BACKGROUND ART

Various types of cooling devices using a liquid-type refrigerant such as water are proposed as means for cooling an object that generates heat during operation (heating element), such as CPUs for computers and secondary batteries for electric vehicles. For example, a cooling device, having a flow channel to circulate a refrigerant inside a casing made of a material with high heat dissipation such as metal, is known.

A cooling device having a configuration as described above is generally formed by bonding metal members by brazing in order to withstand inner pressure from the refrigerant circulating inside the device and to prevent leakage of the refrigerant. Patent Document 1 proposes a cooling device that is manufactured by a method in which welding and spot welding are used for different portions.

PRIOR ART DOCUMENT

Patent Document

[Patent Document 1] Japanese Patent Application Laid-Open No. 2015-210032

SUMMARY OF THE INVENTION

Problem to be Solved by the Invention

Conventional cooling devices are produced by a method including bonding the parts of the casing by brazing, and subsequently bonding a component such as a joint to the casing by brazing. Since the method includes a two-stage process of brazing, there are problems in that the procedure is complicated and in that the strength of the casing may deteriorate due to the heat applied during the brazing.

Meanwhile, there have been demands for reduction in weight or reduction in production cost of the cooling devices, in view of a recent trend toward diversification of purpose of cooling devices in addition to increasingly complex configurations thereof, with brazing alone unable to meet the needs of this diversification in recent years.

In particular, for a cooling device used with a liquid-type refrigerant, there is demand for a manufacturing method in which the bonding is performed by a technique other than brazing while ensuring airtightness between the casing and the components attached to the casing.

In view of the aforementioned circumstances, the present invention aims to provide a cooling device and a method for manufacturing the cooling device, which has a portion made of metal and a portion made of resin and exhibits excellent airtightness.

Means for Solving the Problem

The means for implementing the invention includes the following embodiments.

<1> A cooling device having a casing and a flow channel that is disposed inside the casing, the casing includes a metal portion and a resin portion that is bonded to at least a portion of the metal portion.

<2> A cooling device having a casing and a flow channel that is disposed inside the casing, the casing includes a metal portion and a resin portion that is bonded to at least a portion of the metal portion, with a surface of the metal portion that is bonded to the resin portion being roughened.

<3> A cooling device having a casing and a flow channel that is disposed inside the casing, the casing includes a metal portion and a resin portion that is bonded to at least a portion of the metal portion, with the casing having a plurality of metal portions and the resin portion is disposed between the metal portions. A surface of the metal portion that is bonded to the resin portion is optionally roughened.

<4> A cooling device having a casing and a flow channel that is disposed inside the casing, the casing includes a metal portion and a resin portion that is bonded to at least a portion of the metal portion, with the resin portion is disposed at a periphery of the casing. A surface of the metal portion that is bonded to the resin portion is optionally roughened. The casing having a plurality of metal portions and the resin portion is optionally disposed between the metal portions.

Effect of the Invention

According to the present invention, a cooling device and a method for manufacturing the cooling device, which has a portion made of metal and a portion made of resin and exhibits excellent airtightness, are provided.

EMBODIMENTS FOR IMPLEMENTING THE INVENTION

Figure 1:
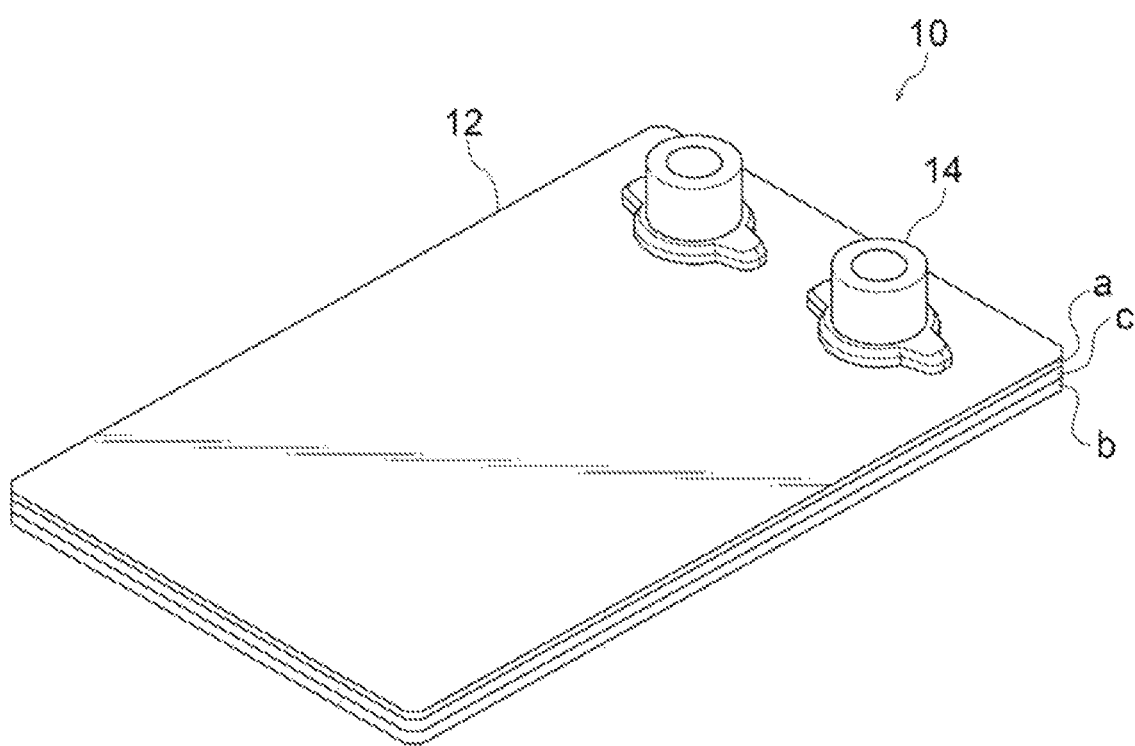
FIG. 1 is a schematic external view of an exemplary configuration of a component for a cooling device of an embodiment according to the present invention.

In the present disclosure, a numerical range indicated using "to" includes the numerical values before and after "to" as a minimum value and a maximum value, respectively.

In numerical ranges stated in a stepwise manner in the present disclosure, the upper limit value or the lower limit value stated in one numerical range may be replaced with the upper limit value or the lower limit value of another numerical range stated in a stepwise manner. Further, in the numerical range stated in the present disclosure, the upper limit value or the lower limit value of the numerical range may be replaced with the value shown in the examples.

In the present disclosure, each component may contain a plurality of substances corresponding thereto. When a plurality of substances corresponding to each component is present in the composition, the content of each component refers to the total content of the plurality of substances present in the composition, unless otherwise specified.

Cooling Device (First Embodiment)

The cooling device according to the first embodiment is a cooling device that includes a casing that includes a metal, a flow channel that is disposed inside the casing, and a component that includes a resin and is bonded to a surface of the casing.

In the cooling device as described above, a component being bonded to a surface of a casing includes a resin. Therefore, it is possible to meet the demands such as complicated configuration, reduced weight and reduced production cost, as compared with a cooling device having a component made of metal.

In the cooling device, a component including a resin is bonded to a surface of the casing. In the disclosure, the "bond" refers to a state in which a component is integrated with a surface of the casing without adhesives, screws or the like. In that case, for example, the component can be tightly attached to a desired portion of the casing, as compared with a case in which the component is produced in a separate process and attached to a surface of the casing using adhesives, screws or the like, thereby achieving favorable airtightness.

In the cooling device, when the component has a portion made of a material other than a resin and a portion made of a resin, it is possible to use the portion made of a resin as a means to connect the component with the casing. In that case, for example, it is possible to produce a cooling device in which two or more kinds of metals, which are difficult to bond to each other by brazing or welding, are used for the casing and the component, respectively.

As necessary, the cooling device may have a component that is attached to the casing by way of brazing, welding, adhesives, screws or the like. In that case, the component is not restricted to be those including a resin, and may be totally made of a material other than a resin.

In the following, details of the cooling device according to the first embodiment are explained. However, the invention is not restricted to the embodiment.

<Casing>

The casing is not restricted as long as it includes a metal and has a shape in which a flow channel can be disposed.

From the viewpoint of the cooling performance, the casing preferably has a shape that ensures a sufficient area of a portion that contacts the heat element. For example, the casing may have a shape including two principal surfaces facing each other and a side with a thickness that is enough to dispose a flow channel in the casing. The shape of the principal surfaces of the casing (surfaces having the largest area) is not particularly limited, and may be a rectangular shape, a circular shape or the like. The principal surfaces of the casing may be flat or curved.

The metal included in the casing is not particularly limited, and may be selected depending on the purpose of the cooling device or the like. For example, the metal may be at least one selected from the group consisting of iron, copper, nickel, gold, silver, platinum, cobalt, zinc, lead, tin, titanium, chromium, aluminum, magnesium, manganese, and an alloy including the metal (such as stainless steel, brass and phosphor bronze).

From the viewpoint of thermal conductivity, the metal is preferably aluminum, aluminum alloy, copper and copper alloy, more preferably copper and copper alloy.

From the viewpoint of reducing the weight and securing the strength, the metal is more preferably aluminum and aluminum alloy.

The size of the casing is not particularly limited, and may be selected depending on the purpose of the cooling device or the like. For example, the area of the principal surface of the casing may be from 50 $cm^2$ to 5,000 $cm^2$. The thickness of the casing may be from 1 mm to 50 mm.

From the viewpoint of the bonding strength of the component to be disposed on a surface of the casing, the surface of the casing is preferably roughened. When the surface of the casing is roughened, a portion of the component at a surface thereof enters a concave-convex structure of the roughened surface of the casing, whereby an anchor effect is exhibited, and the component is tightly bonded to the casing.

The state of the concave-convex structure formed at a surface of the casing is not particularly limited as long as a sufficient degree of bonding strength with respect to the component is achieved.

The average pore size of the concave portion in the concave-convex structure may be, for example, from 5 nm to 250 µm, preferably from 10 nm to 150 µm, more preferably from 15 nm to 100 µm.

The average depth of the concave portion in the concave-convex structure may be, for example, from 5 nm to 250 µm, preferably from 10 nm to 150 µm, more preferably from 15 nm to 100 µm.

When at least one of the average pore size or the average depth of the concave portion in the concave-convex structure is within the above ranges, the bonding of the component to the casing tends to be stronger.

The average pore size and the average depth of the concave portion in the concave-convex structure can be measured with an electronic microscope or a laser microscope. Specifically, the average pore size and the average depth of the concave portion are calculated as an arithmetic average value of the measured values of 50 concave portions, which are arbitrarily selected from an image of a surface of the casing and an image of a section of the surface of the casing.

The method for the roughening of a surface of the casing is not particularly limited, and may be performed by various known methods.

Examples of the method include a method using laser light as described in Japanese Patent No. 4020957; a method of immersing a surface of the casing in an aqueous solution of an inorganic base such as NaOH or an inorganic acid such as HCl or $HNO_3$; a method of subjecting a surface of the casing to anodization as described in Japanese Patent No. 4541153; a substitution crystallization method in which a surface of the casing is etched with an aqueous solution including an acid-based etchant (preferably an inorganic acid, ferric ion or cupric ion) and optionally including manganese ions, aluminum chloride hexahydrate, sodium chloride or the like, as described in International Publication No. 2015/8847; a method of immersing a surface of the casing in an aqueous solution of at least one selected from hydrazine hydrate, ammonia or a water-soluble amine compound (hereinafter, also referred to as an NMT method), as described in International Publication No. 2009/31632; a method of treating a surface of the casing with a warm water, as described in JP-A No. 2008-162115; and a blast treatment.

It is possible to select a method for roughening depending on the material of the surface of the casing, desired configurations of the concave-convex structure, and the like.

The surface of the casing may be subjected to a treatment to add a functional group, in addition to the roughening treatment. The addition of a functional group to a surface of the casing increases the amount of chemical binding sites between the surface of the casing and the component, and the bonding strength thereof tends to further improve.

The treatment to add a functional group to a surface of the casing is preferably performed either at the same time as the roughening treatment or after the roughening treatment.

The method for the addition of a functional group to a surface of the casing is not particularly limited, and may be performed by various known methods.

Examples of the method include a method of immersing a surface of the casing to a solution prepared by dissolving a chemical substance having a functional group to water or an organic solvent such as methyl alcohol, isopropyl alcohol, ethyl alcohol, acetone, toluene, ethyl cellosolve, dimethyl formaldehyde, tetrahydrofuran, methyl ethyl ketone, benzene, ethyl acetate ether or the like; a method of coating or spraying a surface of the casing with a chemical substance having a functional group or a solution including the same; and a method of attaching a film including a chemical substance having a functional group to a surface of the casing.

When the addition of a functional group is performed at the same time as the roughening, examples of the method for the addition include wet etching, chemical conversion treatment, anode oxidation, and the like, with a solution including a chemical substance having a functional group.

The casing may include a metal portion and a resin portion that is bonded to at least a part of the metal portion. When a part of the casing is a resin portion, it is possible to meet the demands such as complicated shape, reduction in weight and reduction in production costs, as compared with a case in which the casing is totally made of metal.

The details and preferred embodiments of the casing including a metal portion and a resin portion are the same as the details and preferred embodiments of the casing of the cooling device according to the second embodiment, as described later.

The resin included in the resin portion of the casing is not particularly limited, and may be selected depending on the purpose of the cooling device and the like.

Examples of the resin include thermoplastic resins (including elastomers) such as polyolefin resin, polyvinyl chloride, polyvinylidene chloride, polystyrene resin, AS resin, ABS resin, polyester resin, poly(meth)acrylic resin, polyvinyl alcohol, polycarbonate resin, polyamide resin, polyimide resin, polyether resin, polyacetal resin, fluorine resin, polysulfone resin, polyphenylene sulfide resin and polyketone resin; and thermosetting resins such as phenol resin, melamine resin, urea resin, polyurethane resin, epoxy resin and unsaturated polyester resin. The resin may be used alone or in combination of two or more kinds.

From the viewpoint of moldability, the resin included in the component is preferably a thermoplastic resin.

The resin included in the component may include an additive of various kinds. Examples of the additive include a filler, a thermal stabilizer, an antioxidant, a pigment, a whether resistant, a fire retardant, a plasticizer, a dispersant, a lubricant, a release agent, and an antistatic agent.

<Component>

The component is not particularly limited, as long as it includes a resin and is bonded to a surface of the casing. Specific examples of the component include a joint that connects a flow channel disposed inside the casing with an external tube, and a rib that is disposed outside the casing for the purpose of reinforcement.

The state in which the component is bonded to a surface of the casing can be formed by, for example, applying a molten resin to a surface of the casing. When the resin is in a melted state at the time of being applied to a surface of the casing, the degree of adhesion with respect to a surface of the casing is improved (for example, the resin enters the concave-convex structure at the surface of the casing and an anchor effect is exhibited), whereby the component is tightly bonded to the surface of the casing.

The resin in a melted state may be formed to a desired shape using a mold or the like. The method for the forming is not particularly limited, and may be selected from known methods such as injection molding.

The position or the number of the component in the cooling device is not particularly limited, and may be selected depending on the shape, usage and the like of the cooling device. In an embodiment, the component may be disposed one of the principal surfaces of the casing. For example, when the cooling device is used such that one of the principal surfaces faces a heating element, the component may be disposed at a principal surface other than a principal surface that faces the heating element.

The resin included in the component is not particularly limited, and may be selected depending on the purpose of the cooling device and the like. For example, the resin included in the component may be selected from the resins that may be included in the resin portion of the casing, as described above.

From the viewpoint of workability, the resin included in the component is preferably a thermoplastic resin.

In the present disclosure, the "component including a resin" includes a component totally made of a resin (and optional additives) and a component having a portion made of a material other than a resin (such as metal, ceramics, carbon, glass). When a part of the component is made of a metal, the metal may be selected from the metals that may be included in the component to be described later.

When a part of the component is made of a material other than a resin, the component preferably has a portion that contacts a surface of the casing being made of a resin, from the viewpoint of the bonding strength with respect to a surface of the casing.

Examples of the component having a portion being made of a material other than a resin include a component having a tubular shape, such as a joint, with an inner periphery (or an outer periphery) being made of a resin and an outer periphery (or an inner periphery) being made of a metal; and a component having a portion that contacts a surface of the casing (basal portion) being made of a resin and a portion that is disposed over the basal portion being made of a material other than a resin.

<Flow Channel>

The flow channel is not particularly limited, as long as it is disposed inside the casing and has a shape through which a refrigerant can flow. For example, the flow channel may be integrally formed with a member that constitutes the casing by press molding or the like, or may be formed independently from the casing and then disposed inside the casing. Alternatively, a flow channel including a resin may be bonded to a surface of the inside of the casing, which is roughened as necessary.

The material of the flow channel is not particularly limited, and may be selected depending on the material of the casing or the component, the type of the refrigerant, and the like. When the flow channel is made of a metal, the metal may be selected from the metals that may be included in the casing as described above. When the flow channel is made of a resin, the resin may be selected from the resins that may be included in the casing as described above. The flow channel may be formed of two or more different materials (for example, a resin and a metal).

<Exemplary Configurations of Cooling Device>

In the following, exemplary configurations of the cooling device are explained by referring to the drawings. In the drawings, structural components of the same kind are denoted by the same symbol, and the explanation thereof may be omitted as appropriate.

FIG. 1 is a schematic external view of an exemplary configuration of the cooling device. In FIG. 1, cooling device 10 has casing 12 and component 14 that is attached to a surface of casing 12. A flow channel through which a refrigerant flows (not shown) is disposed inside casing 12.

In cooling device 10 shown in FIG. 1, casing 12 has a flat rectangular shape. Accordingly, casing 12 can ensure a sufficient area of a principal surface thereof, which is to be in contact with a heating element, and a sufficient cooling effect can be achieved.

In cooling device 10 shown in FIG. 1, metal portion a and metal portion b constitute the principal surfaces of casing 12, and metal portion c constitutes the side of casing 12. Resin portion c is bonded to surfaces of metal portion a and metal portion b, respectively. Namely, resin portion c functions to connect metal portion a with metal portion b in an indirect manner, in addition to forming the side surface (peripheral portion) of casing 12.

In cooling device 10 shown in FIG. 1, component 14 is disposed only at a surface of metal portion a. In this configuration, when metal portion b is disposed to face a heating element, a sufficient area of casing 12 to be in contact with a heating element can be ensured. In addition, since component 14 is disposed at an upper surface but not at a side surface, cooling device 10 has an advantage in the maintenance thereof.

For example, when a trouble occurs in a cooling unit that is composed of plural cooling devices, having component 14 at a surface other than a principal surface of the casing thereof, it is necessary to retrieve the entire body of the cooling unit. When the cooling devices have component 14 at a principal surface of the casing thereof, it is possible to retrieve only a cooling device with a trouble, thereby facilitating the maintenance process.

In cooling device 10 shown in FIG. 1, component 14 has a shape of a joint that connects the flow channel with the exterior of cooling device 10. In the configuration shown in FIG. 1, a joint for supplying a refrigerant from the exterior to the flow channel is disposed adjacent to a joint for discharging the refrigerant from the flow channel to the exterior. However, the arrangement of the joints is not limited to this configuration, and may be modified depending on the shape of the flow channel and the like.

In cooling device 10 shown in FIG. 1, the entire body of component 14 may be formed of a resin, or a portion of component 14 may be formed of a material other than a resin. Modified examples of the configuration of component 14 are shown in FIG. 2 to FIG. 5.

Figure 2:
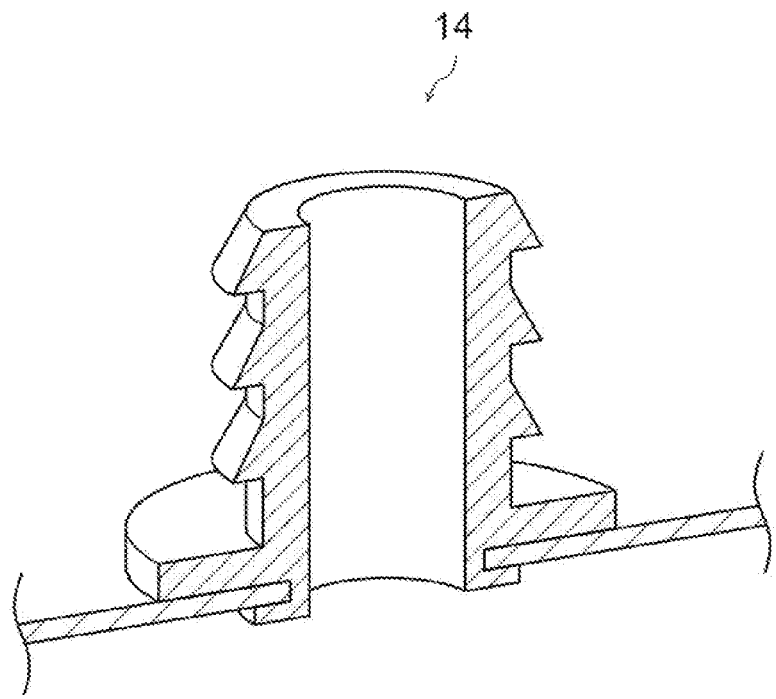
FIG. 2 is a schematic sectional view of a modified example of a component for a cooling device shown in FIG. 1.

FIG. 2 is a schematic sectional view of a modified example of component 14, which is totally formed of a resin.

Figure 3:
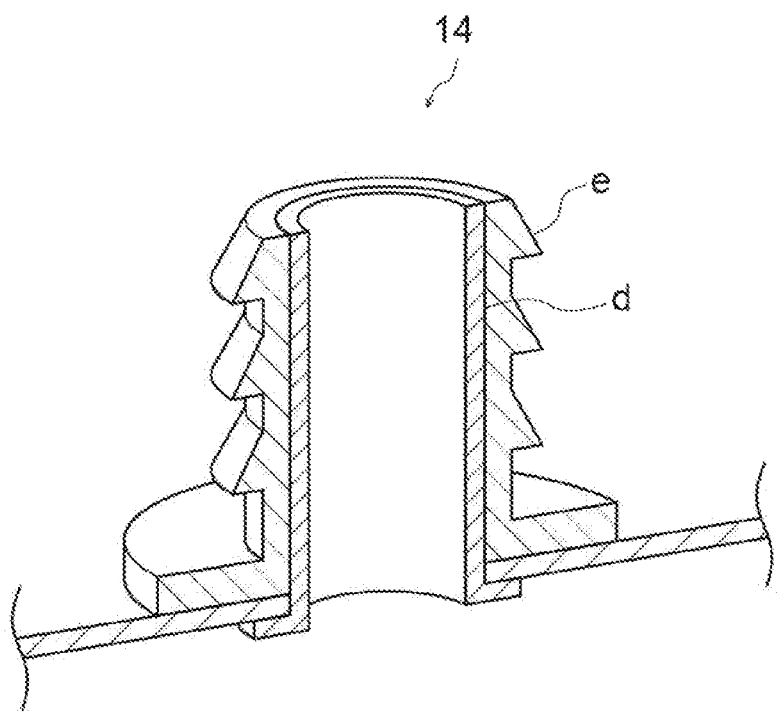
FIG. 3 is a schematic sectional view of a modified example of a component for a cooling device shown in FIG. 1.

FIG. 3 is a schematic sectional view of a modified example of component 14, in which inner side d of a tubular portion is formed of a resin and outer side e of the tubular portion is formed of a material other than a resin (such as a metal).

Figure 4:
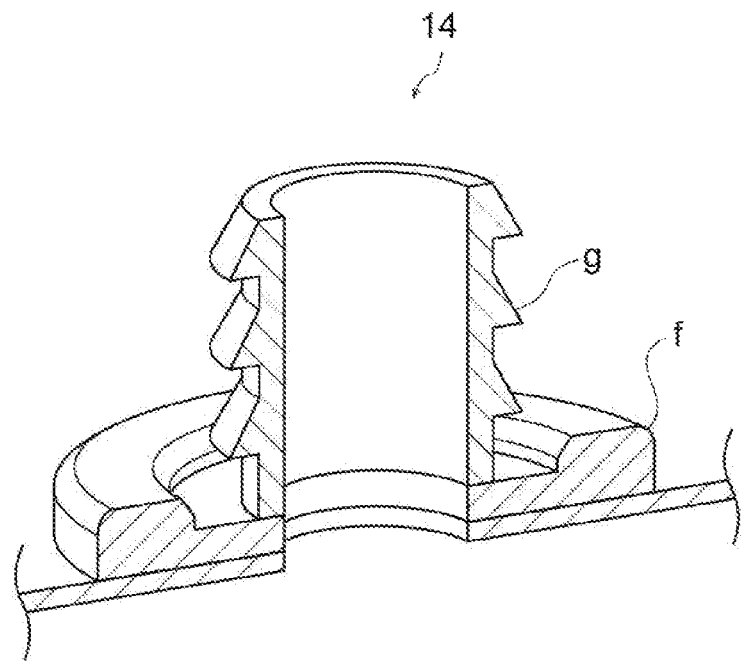
FIG. 4 is a schematic sectional view of a modified example of a component for a cooling device shown in FIG. 1.

FIG. 4 is a schematic sectional view of a modified example of component 14, in which a portion that is close to casing 12 (basal portion f) is formed of a resin and a portion over basal portion (upper portion g) is formed of a material other than a resin (such as a metal).

Figure 5:
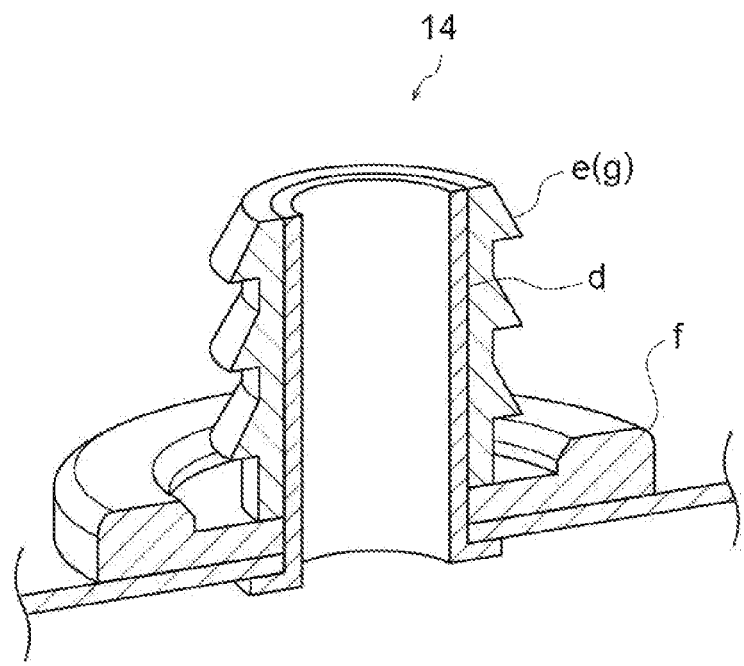
FIG. 5 is a schematic sectional view of a modified example of a component for a cooling device shown in FIG. 1.

FIG. 5 is a schematic sectional view of a modified example of component 14, in which inner side d of a tubular portion is formed of a resin, outer side e of the tubular portion is formed of a material other than a resin (such as a metal), basal portion f is formed of a resin, and upper portion g is formed of a material other than a resin (such as a metal).

Cooling Device (Second Embodiment)

The cooling device according to the second embodiment is a cooling device that includes a casing and a flow channel that is disposed inside the casing, the casing including a metal portion and a resin portion that is bonded to at least a portion of the metal portion.

The cooling device as described above has a part of the casing being a resin portion. Accordingly, it is possible to meet the demands such as complicated shape, reduction in weight, reduction in production costs and the like, as compared with a cooling device having a casing that is totally made of a metal.

In the cooling device, at least a part of the metal portion that constitutes the casing is bonded to the resin portion. Accordingly, for example, the resin portion can be tightly bonded to the metal portion and favorable airtightness is achieved, as compared with a cooling device in which a resin portion is independently prepared and attached to a surface of a metal portion with adhesives, screws or the like.

Further, in the cooling device, it is possible to utilize the resin portion as a means for connecting the metal portions, by disposing the resin portion between two or more of the metal portions and bonding the resin portion to a surface of the metal portions. Accordingly, for example, it is possible to produce a cooling device in which two or more kinds of metals, which cannot be bonded by brazing or welding, are used in combination.

In the following, the cooling device according to the second embodiment are described in detail. However, the present invention is not limited to these embodiments.

<Casing>

The casing is not particularly limited, as long as it includes a metal portion and a resin portion that is bonded to at least a portion of the metal portion, and has a configuration in which a flow channel can be disposed. From the viewpoint of the cooling performance of the cooling device, the casing preferably has a shape that can ensure a sufficient area of a portion to be in contact with a heating element. For example, the casing may have a shape having two principal surfaces, which are facing each other, and a side surface with a thickness that is enough to dispose a flow channel. The shape of the principal surface (a surface having the largest area) of the casing is not particularly limited, and may be rectangular, round or the like. The principal surface of the casing may be flat or curved.

From the viewpoint of the cooling performance, at least a portion of the casing to be in contact with a heating element is preferably made of a metal.

The number of the metal portion and the resin portion that constitute the casing is not particularly limited, and may be one or two or more, respectively.

When the casing has two or more metal portions, the resin portion may be disposed between the two or more metal portions. In that case, all of the metal portions may be bonded with the resin portion, or at least one of the metal portions may be bonded with the resin portion.

The metal included in the metal portion and the resin are not particularly limited, and may be selected depending on the purpose of the cooling device and the like. For example, the metal and the resin may be selected from the metals and the resins that may be included in the casing of the cooling device according to the first embodiment.

The size of the casing is not particularly limited, and may be selected depending on the purpose of the cooling device and the like. For example, the area of a principal surface of the casing may be within a range of from 50 $cm^2$ to 5,000 $cm^2$. The thickness of the casing may be within a range of from 1 mm to 50 mm.

From the viewpoint of the bonding strength between the resin portion and the metal portion, the metal portion preferably has a roughened surface. When the surface of the metal portion is roughened, a portion of the rein portion at a surface thereof enters the concave-convex structure of the roughened surface of the casing, whereby an anchor effect is exhibited, and the metal portion is tightly bonded to the metal portion.

The details and preferred embodiments of the roughening are the same as the details and preferred embodiments of the roughening to be performed on a surface of the casing of the cooling device according to the first embodiment.

<Component>

The cooling device may have a component to be attached to the casing.

The type of the component to be attached to the casing is not particularly limited. Specific examples of the component include a joint that connects a flow channel disposed inside the casing with an external tube, and a rib that is disposed outside the casing for the purpose of reinforcement.

The material for the component is not particularly limited, and may be a resin, a material other than a resin, or a combination thereof.

The method for attaching the component to the casing is not particularly limited. For example, the component may be bonded to a surface of the casing in the same manner as the resin portion as described above. Alternatively, the component may be attached to the casing by a method such as brazing, welding, glueing, fastening or the like.

In an embodiment, the component may include a resin, and may be bonded to a surface of the casing.

The details and preferred embodiments of the component including a resin are the same as the details and preferred embodiments of the component of the cooling device according to the first embodiment.

<Flow Channel>

The flow channel is not particularly limited, as long as it is disposed inside the casing and has a configuration in which a refrigerant can flow.

The details and preferred embodiments of the flow channel are the same as the details and preferred embodiments of the flow channel of the cooling device according to the first embodiment.

In the following, exemplary configuration of the casing are explained by referring to the drawings, as the exemplary configuration of the cooling device according to the second embodiment. With regard to the other portions than the casing, exemplary configurations of the cooling device as mentioned above may be referred to.

Configuration Example 1

In Configuration Example 1 of the casing, two of metal portions are bonded by a resin portion that is disposed at a periphery of the casing. More specifically, the casing has two of the metal portions, each corresponding to principal surfaces of the casing, and a resin portion corresponding to a peripheral portion of the casing (for example, a side portion of the casing), and the metal portions are connected via the resin portion in an direct manner.

Figure 6:
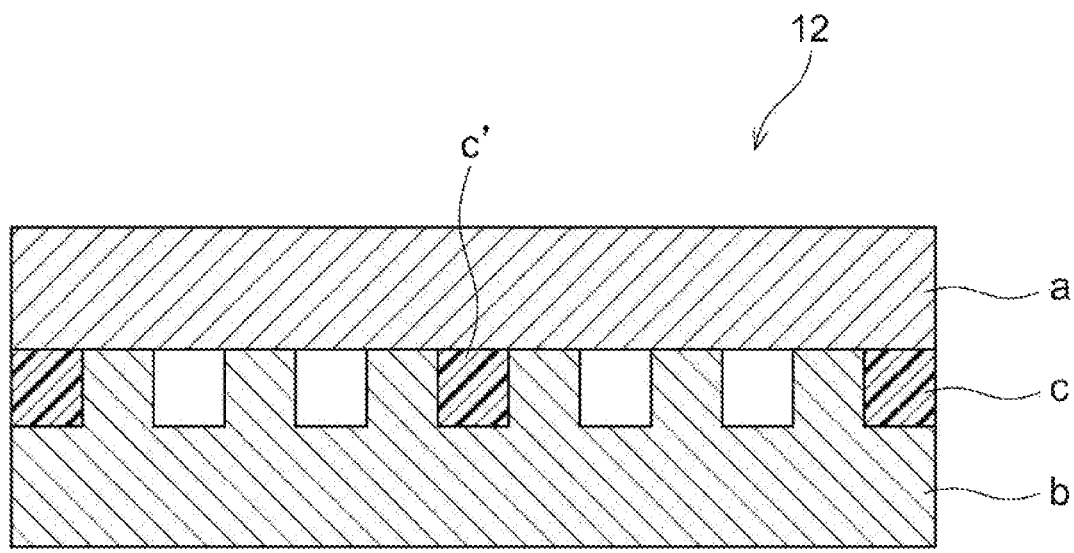
FIG. 6 is a schematic external view of an exemplary configuration of a casing for a cooling device.

FIG. 6 is a schematic sectional view of an exemplary embodiment of the casing having a configuration as described above. Casing 12 shown in FIG. 6 has metal portion a and metal portion b, each corresponding to principal surfaces of casing 12, and resin portion c disposed between metal portion a and metal portion b. Metal portion b has a concave-and-convex pattern corresponding to a shape of a flow channel.

Resin portion c is bonded to each of metal portion a and metal portion b, whereby indirectly connecting metal portion a with metal portion b, and forms a peripheral portion of casing 12. In FIG. 6, inside casing 12, resin portion c' is disposed between metal portion a and metal portion b in order to reinforce casing 12.

The resin portion disposed at a periphery of the casing may have a ribbon shape along the periphery of the casing, or may have a shape in which at least a surface thereof is not in contact with a metal portion.

Figure 7A:
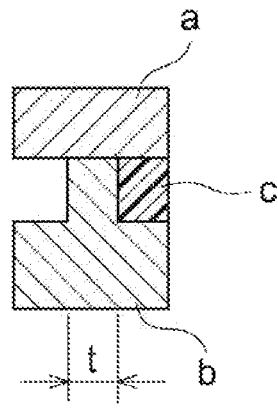
FIGS. 7(A)-7(E) are schematic external views of an exemplary configuration of a resin portion to be disposed at a periphery of a casing.
Figure 7B:
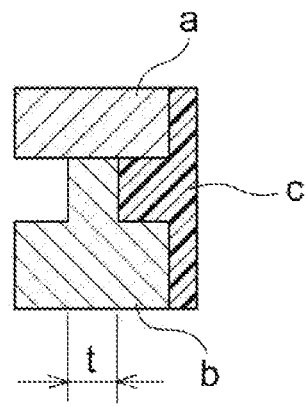
Figure 7C:
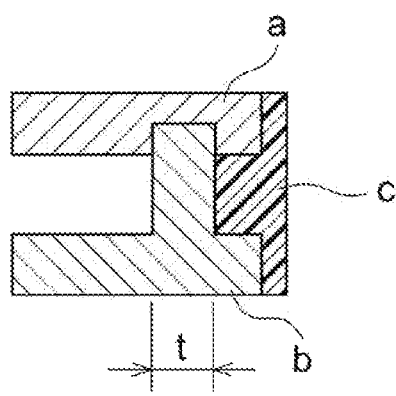
Figure 7D:
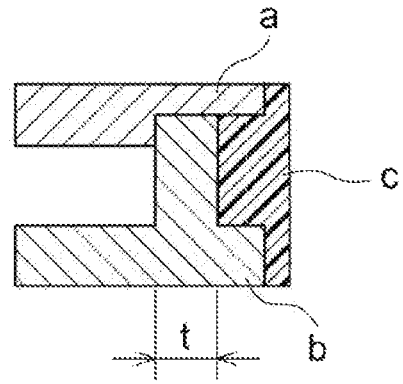
Figure 7E:
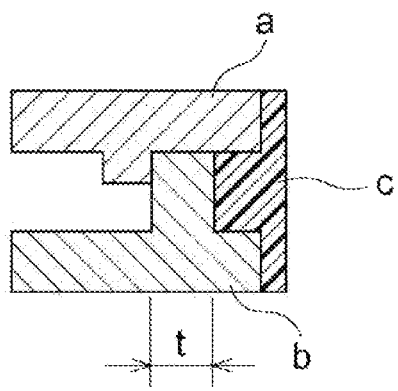

FIGS. 7(A)-7(E) are schematic views of an exemplary configuration of a resin portion to be bonded to metal portions. Specifically, FIG. 7(A) shows a configuration in which resin portion c having a ribbon shape is disposed between metal portion a and metal portion b, and resin portion c is not bonded to a side surface of metal portion a and metal portion b. FIG. 7 (B) shows a configuration in which resin portion c having a ribbon shape is disposed between metal portion a and metal portion b, each corresponding to principal surfaces of the casing, and resin portion c is bonded to a side surface of metal portion a and a side surface of metal portion b. From the viewpoint of a leak-path dimension (overlapping width of a resin capable of sealing) and ease of molding process, a configuration shown in FIG. 7 (B) is preferred.

In a case of forming the casing having a configuration as described above by injection molding, it may be possible to cause deformation of a metal portion due to a pressure applied by a resin, or leakage of a resin into a flow channel. Therefore, the convex portion of metal portion b to be bonded with resin portion c (denoted by t) is preferably has a thickness that is enough to secure the strength to withstand a pressure applied in a process of injection molding. Specifically, the convex portion of metal portion b preferably has a thickness of at least 1 mm, more preferably from 1 mm to 10 mm, further preferably from 1 mm to 5 mm.

In order to enhance the strength of metal portion c, the convex portion of metal portion b may be engaged with a concave portion of metal portion a. Alternatively, as shown in FIG. 7 (D) and FIG. 7 (E), the convex portion of metal portion b may be in contact with a stepped portion or a convex portion of metal portion a. In such cases, it is possible to prevent metal portion b from tilting toward a flow channel by a pressure applied by a resin.

The casing having a configuration as mentioned above has a side portion being made of a resin portion, and the resin portion functions to connect the meal portions as principal surfaces of the casing. Therefore, airtightness of the casing can be ensured without affecting the strength of the metal portions, unlike a case of producing the casing by brazing.

From the viewpoint of ensuring the strength of the cooling device, the casing may have one or more portions at which a metal portion is connected with a resin portion (connecting portion, other than a periphery of the casing (for example, inside the casing).

For example, when the casing has a large principal surface and has the possibility that the casing may expand due to a pressure applied by a refrigerant flowing inside the casing, it is possible to increase the strength of the casing by providing a connecting portion inside the casing, in addition to a periphery of the casing, thereby reducing the possibility. The method to provide a connecting portion inside the casing is not particularly limited. From the viewpoint of simplification of the process, the connecting portion is preferably provided using a resin portion, as with the periphery of the casing.

The casing having a configuration as described above may be produced by, for example, disposing two metal plates corresponding to principal surfaces of the casing in a mold so as to face each other, and filling a gap between the metal plates with a resin by injection molding, thereby forming a metal portion at a periphery of the casing and other bonding portions as necessary. According to this method, it is possible to produce a casing without a process for bending or brazing of metal plates.

Configuration Example 2

In Configuration Example 2, the casing has two of metal portions, corresponding to principal surfaces of the casing and one of which having a flow channel, and a resin portion that is disposed between the metal portions. The resin portion is bonded to one of the metal portions not having the flow channel, and is disposed so as to face the flow channel.

The casing having a configuration as described above is especially favorable when metals of different kinds are used in combination, because the metal portions are isolated from each other by the resin portion disposed between the metal portions. For example, when copper, which is highly thermally conductive, is used for a principal surface that contacts a heating element and aluminum, which is lighter than copper, is used for another principal surface, it is possible to avoid electric corrosion, which may be caused by the contact of different metals, by providing a resin portion between the metal portions. In addition, it is possible to reduce the weight of the casing as compared with a casing that is made entirely of copper.

The casing having a configuration as described above may be produced by, for example, forming a resin portion onto a metal plate by injecting a resin, allowing another metal plate to contact the resin portion, and connecting the peripheral portions of the two principal surfaces by the connecting means as mentioned below. The connecting means for connecting the peripheral portions of the two principal surfaces is not particularly limited, as long as it can secure the airtightness. The connecting means is preferably a bonding means from the viewpoint of improving the airtightness. In this configuration, the connection of the two principal surfaces is performed by disposing a resin at a side surface of the casing, similarly to Configuration Example 1, and details of the method are the same as Configuration Example 1.

As mentioned in Configuration Example 1, the casing may have one or more connection sites on a principal surface as necessary, in addition to a side surface, for the purpose of enhancing the strength of the casing. Details of the connection means are the same as the Configuration Example 1, and are not described herein.

In the present disclosure, the term "connection" refers to a broader concept than bonding. For example, the state of connection encompasses a state in which a resin portion and a metal portion are bonded to each other, a state in which a resin portion is fixed to a metal portion using a means such as an adhesive, a screw, a resin component and the like, and a combination thereof. However, the term is not limited thereto.

In the present disclosure, the term "abut" refers to a state in which a resin portion is in contact with a surface of a metal portion but not fixed thereto.

The resin portion that is disposed between the metal portions may be bonded to an entire surface of a metal portion at which a flow channel is not formed; or may be bonded only to regions, corresponding to convex portions of a flow channel, of a surface of metal portion to which a flow channel is not formed.

Figure 8:
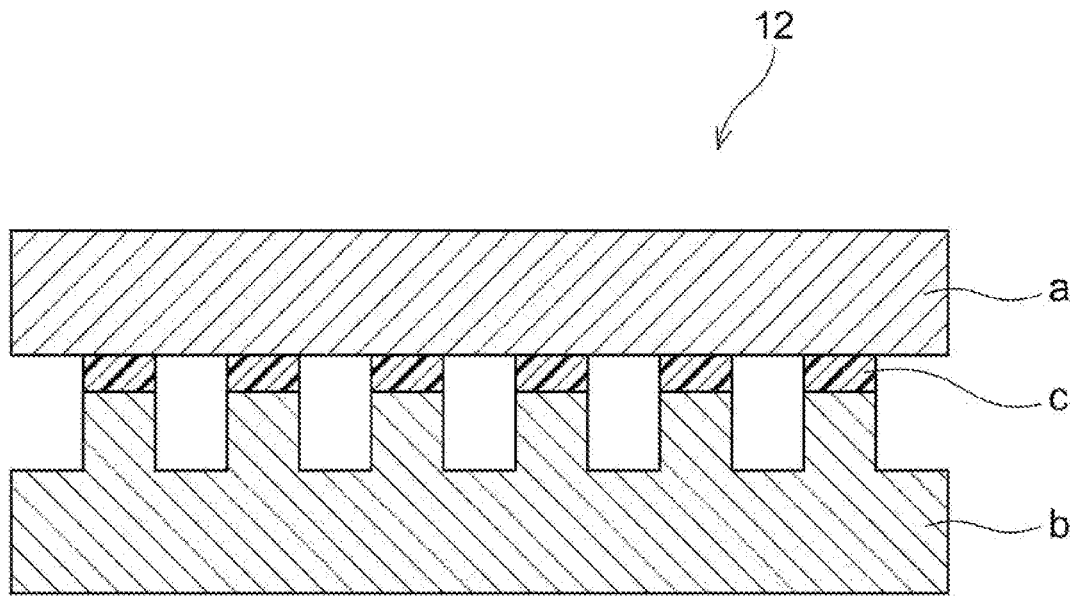
FIG. 8 is a schematic external view of an exemplary configuration of a casing of a cooling device.

FIG. 8 shows a schematic sectional view of the casing having a configuration as mentioned above. In casing 12 of FIG. 8, metal portion a and metal portion b are isolated from each other by resin portions c, which are disposed at convex portions of a flow channel of metal portion b. Therefore, when different metals are used for metal portion a and metal portion b, respectively, electric corrosion due to the contact of the metals is prevented. The casing may be in a state that resin portions c are bonded to metal portion a, to which a flow channel is not formed, but are connected or abut with respect to metal portion b, to which a flow channel is formed, by a method other than bonding, for example.

Configuration Example 3

The casing of Configuration Example 3 includes two metal portions each corresponding to principal surfaces of the casing and a resin portion that is disposed between the two metal portions, the resin portion forming a flow channel.

Figure 9:
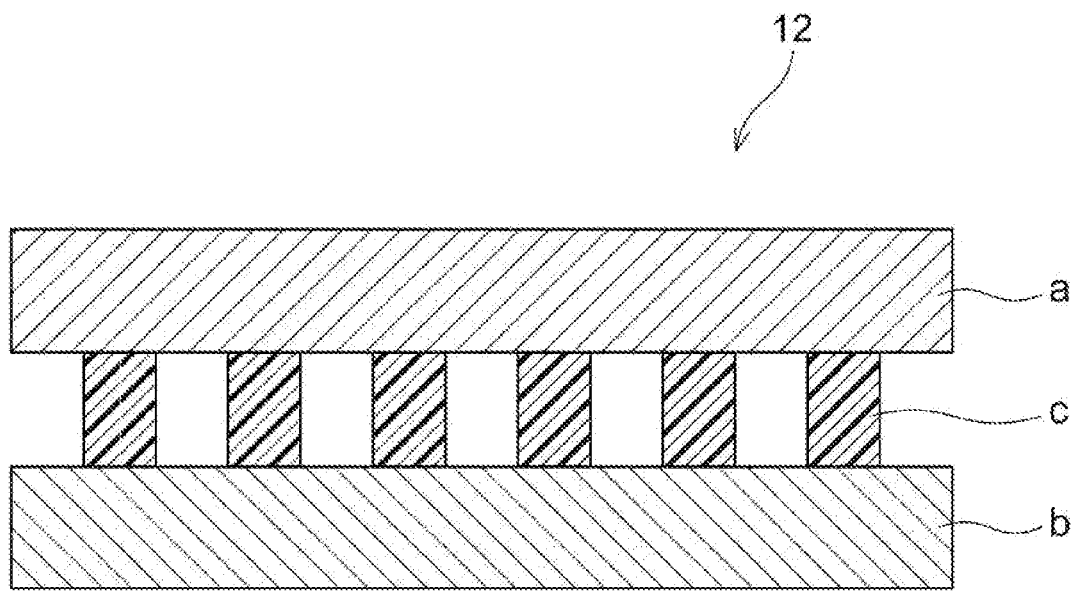
FIG. 9 is a schematic external view of an exemplary configuration of a casing of a cooling device.

FIG. 9 schematically shows another example of a section of the casing having a configuration as described above. In casing 12 shown in FIG. 9, unlike FIG. 8, resin portions c are disposed between metal portion a and metal portion b, each corresponding to principal surfaces of the casing. The resin portions c isolate the metal portions from each other and form a flow channel. For example, resin portions c may be connected to metal portion a by bonding but connected to metal portion b by a method other than bonding, or abut metal portion b.

<Purposes of Cooling Device>

The purpose of the cooling device according to the present disclosure is not particularly limited. For example, the cooling device is suitably used for cooling a heating element such as CPUs in computers and secondary batteries in electric vehicles. Further, the cooling device is suitably used for any purposes requiring temperature control, such as air-conditioning systems, hot-water supply systems and power-generating systems.

<Method of Manufacturing Cooling Device>

The method of manufacturing a cooling device according to the present disclosure is a method of manufacturing a cooling device, the cooling device including a casing including a first metal member and a second metal member, a flow channel that is disposed inside the casing, and a component that includes a resin and is bonded to a surface of the first metal member, the method including:
- a process of bonding the component to the first metal member; and
- a process of connecting the second metal member with the first metal member to which the component is bonded, in this order.

According to the method as described above, it is possible to produce a cooling device having excellent airtightness.

Specifically, since the process of bonding a component to a first metal member is performed by injection molding with a molten resin or the like, a great pressure is applied to the first metal member. Meanwhile, since the casing of the cooling device has a space therein for installing a flow channel, the casing is susceptible to an external force. Therefore, if a component is bonded to a first metal member that is connected with a second metal member, there is a possibility that the casing is compressed during the bonding, thereby causing deformation or breakage of the casing.

According to the method as described above, a first metal member and a second metal member are connected together after a process of bonding a component to the first metal member. Therefore, deformation, breakage or the like of the casing can be effectively suppressed. As a result, a cooling device having excellent airtightness can be produced.

From the viewpoint of the bonding strength between the component and the first metal member, a surface of the first metal member is preferably roughened. The details and preferred embodiments of the roughening are the same as the details and preferred embodiments of the roughening for a surface of a casing of the cooling device as described above.

The type of the component is not particularly limited. In an embodiment, the component is a joint that connects a flow channel that is disposed inside the casing with an external tube.

The embodiment of the connection of the first metal member with the second metal member in the casing is not particularly limited. For example, the metal members may be bonded to each other by welding or the like, or the metal members may be connected via another member such as a resin. Further, the flow channel included in the cooling device may be formed integrally with the first metal member or the second metal member, or may be formed from another member such as a resin.

In an embodiment, the casing may have principal surfaces facing each other, and the principal surfaces may be formed from the first metal member and the second metal member, respectively.

The details and preferred embodiments of the cooling device produced by the method, and the details and preferred embodiments of the metal member, the component and the flow channel used in the method are the same as the details and preferred embodiments of the cooling device as described above, and the details and preferred embodiments of the metal member, the component and the flow channel included in the cooling device. Specifically, the method as describe may be a method for manufacturing the cooling device as described above.

EXAMPLES

In the following, the embodiments according to the invention are explained in detail by referring to the examples, but the invention is not limited thereto.

Two aluminum plates each having a size of 150 mm×80 mm×2 mm were prepared as the material for the principal surfaces of the cooling device. One of the aluminum plates has a flow channel (height: 2 mm) formed by press molding, and the other aluminum plate has through holes (diameter: 10 mm) at positions at which a refrigerator is supplied or discharged.

The surfaces of the aluminum plates were etched by immersing in a chemical solution (AMALPHA® A-10201, MEC Co., Ltd.) for 5 minutes. Subsequently, the aluminum plates were subjected to water washing, alkali washing (immersing in 5% NaOH aqueous solution for 20 seconds), water washing, neutralization (immersing in 5% $H_2SO_4$ aqueous solution for 20 seconds) and water washing in a consecutive manner, whereby the surfaces of the aluminum plates were roughened.

The surfaces of the aluminum plates after the roughening was observed with an electron microscope, and it was confirmed that a concave-and-convex structure with an average pore size of from 5 nm to 250 μm and an average pore depth of from 5 nm to 250 μm was formed.

The aluminum plate having thorough holes was disposed in a mold for injection molding. Subsequently, a molten resin (polyphenylene sulfide (PPS), SUSTEEL™ SGX-120, Tosoh Corporation) was injected into the mold, thereby forming joints from the resin around the through holes. The joints were in a state of being bonded to a surface of the aluminum plate around the through holes.

The aluminum plate with the joints and the aluminum plate with the flow channel were disposed in a mold for injection molding, such that the aluminum plates were facing each other across the flow channel. Subsequently, a molten resin (polyphenylene sulfide (PPS), SUSTEEL™ SGX-120, Tosoh Corporation) was injected into the mold to form side surfaces from the resin, thereby obtaining a cooling device having a configuration as shown in FIG. 1. The side surfaces were in a state of being bonded to the surfaces of the aluminum plates.

A refrigerant (water) was injected into the cooling device and allowed to flow inside the cooling device at high pressure. As a result, separation of the joints from the aluminum plates, leakage of the refrigerant, deformation of the casing or the like was not caused, and it was confirmed that the cooling device had a sufficient degree of airtightness.

The disclosures of Japanese Patent Application Nos. 2019-099573 and 2019-105544 are herein incorporated entirely by reference. All publications, patent applications, and technical standards mentioned in this specification are herein incorporated by reference to the same extent as if each individual publication, patent application, or technical standard was specifically and individually indicated to be incorporated by reference.

The invention claimed is:

1. A cooling device, comprising a casing and a flow channel inside the casing, the casing comprising a first metal portion, a second metal portion and a resin portion, wherein each of the first metal portion and the second metal portion has a principal surface, the principal surface of the first metal portion faces the principal surface of the second metal portion, the principal surface of the first metal portion and the principal surface of the second metal portion are principal surfaces of the casing, the principal surface of the first metal portion has a concave-and-convex pattern corresponding to a shape of the flow channel, the resin portion is between the first metal portion and the second metal portion, the resin portion is bonded to each of the first metal portion and the second metal portion, thereby connecting the first metal portion with second metal portion, a convex part of the concave-and-convex pattern of the principal surface of the first metal portion is in direct contact with the principal surface of the second metal portion.

2. The cooling device according to claim 1, wherein the resin portion is bonded to a roughened surface of at least one of the first metal portion and the second metal portion.

3. The cooling device according to claim 1, wherein the resin portion is disposed at a periphery of the casing.

4. The cooling device according to claim 3, wherein the resin portion has a ribbon shape along the periphery of the casing.

5. A method of manufacturing a cooling device, the cooling device comprising a casing including a first metal member and a second metal member, a flow channel inside the casing, and a resin component, the method comprising:

bonding the resin component to the first metal member by injection molding; and then providing by injection molding a resin member between the first metal member and the second metal member having a concave-and-convex pattern corresponding to a shape of the flow channel and thereby connecting the second metal member with the first metal member previously bonded to the resin component.

6. The method of manufacturing a cooling device according to claim 5, further comprising forming the flow channel within the second metal member, wherein the flow channel is integrally formed within the second metal member, wherein said forming is performed prior to said connecting the second metal member with the first metal member.

7. The method of manufacturing a cooling device according to claim 5, wherein said bonding comprises bonding the resin component to a roughened surface of the first metal member.

* * * * *